US010879363B2

(12) United States Patent
Blank et al.

(10) Patent No.: US 10,879,363 B2
(45) Date of Patent: Dec. 29, 2020

(54) NEEDLE CELL TRENCH MOSFET

(71) Applicant: Infineon Technologies Austria AG, Villach (AT)

(72) Inventors: Oliver Blank, Villach (AT); Marcel Rene Mueller, Bendorf (DE); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/366,341

(22) Filed: Mar. 27, 2019

(65) Prior Publication Data

US 2019/0305092 A1 Oct. 3, 2019

(30) Foreign Application Priority Data

Mar. 28, 2018 (DE) .......................... 10 2018 107 417

(51) Int. Cl.
*H01L 29/40* (2006.01)
*H01L 29/78* (2006.01)
(Continued)

(52) U.S. Cl.
CPC .......... *H01L 29/407* (2013.01); *H01L 21/765* (2013.01); *H01L 29/0696* (2013.01);
(Continued)

(58) Field of Classification Search
CPC ....... H01L 29/402–407; H01L 29/4236; H01L 29/7813; H01L 29/66734; H01L 29/66348;
(Continued)

(56) References Cited

U.S. PATENT DOCUMENTS

| 5,973,360 A | * | 10/1999 | Tihanyi | ............... H01L 29/0653 257/330 |
| 2007/0145416 A1 | * | 6/2007 | Ohta | .................. H01L 29/4236 257/213 |
| 2017/0250256 A1 | | 8/2017 | Siemieniec et al. | |

FOREIGN PATENT DOCUMENTS

DE 102015110737 A1 1/2017
DE 102016103384 A1 8/2017

* cited by examiner

*Primary Examiner* — Sonya McCall-Shepard
(74) *Attorney, Agent, or Firm* — Murphy, Bilak & Homilier, PLLC (57) ABSTRACT

A power semiconductor die has a semiconductor body coupled to a first load terminal and a second load terminal of the power semiconductor die and configured to conduct a load current between the load terminals. The die further comprises: a control trench structure for controlling the load current, the control trench structure extending into the semiconductor body along a vertical direction and arranged in accordance with a horizontal grid pattern having a plurality of grid openings; a plurality of power cells, each power cell being, in a horizontal cross-section, at least partially arranged in a respective one of the plurality of grid openings. At least one of the power cells comprises: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a control section with at least one control electrode section in the control trench structure; a columnar field plate trench extending into the semiconductor body along the vertical direction and including a field plate electrode electrically coupled to the first load terminal, the columnar field plate trench having a deep portion below the channel zone section and a proximal portion above the deep (Continued)

portion, the proximal portion vertically overlapping with the channel zone section, wherein a deep horizontal width of the deep portion amounts to at least 110% of a proximal horizontal width of the proximal portion.

20 Claims, 4 Drawing Sheets

(51) Int. Cl.
    *H01L 29/66*     (2006.01)
    *H01L 29/10*     (2006.01)
    *H01L 21/765*     (2006.01)
    *H01L 29/06*     (2006.01)
    *H01L 29/739*     (2006.01)
    *H01L 29/417*     (2006.01)

(52) U.S. Cl.
    CPC .... *H01L 29/1095* (2013.01); *H01L 29/66734* (2013.01); *H01L 29/7813* (2013.01)

(58) Field of Classification Search
    CPC ............. H01L 29/7396; H01L 29/7397; H01L 29/41741; H01L 29/41766; H01L 21/765; H01L 21/768–76816
    See application file for complete search history.

NEEDLE CELL TRENCH MOSFET

TECHNICAL FIELD

This specification is directed to embodiments of a power semiconductor die and to embodiments of a method of processing a power semiconductor die. In particular, this specification is directed to embodiments of a MOSFET having a field plate electrode included in a needle cell trench and to corresponding embodiments of a processing method.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to, switches in power supplies and power converters.

A power semiconductor device usually comprises a power semiconductor die configured to conduct a load current along a load current path between two load terminals of the device. A first load terminal, e.g., a source terminal, may be arranged at a front side of the die, and a second load terminal, e.g., a drain terminal, may be arranged at a back side of the die. The die may be included within a package of the power semiconductor device, wherein such package may provide for electrical connections to the load terminals.

Further, the load current path may be controlled by means of a control electrode, often referred to as gate electrode. For example, upon receiving a corresponding control signal from, e.g., a driver unit, the control electrode may set the power semiconductor die in one of a conducting state and a blocking state.

For conducting the load current, the power semiconductor die may have one or more power cells which may be arranged in a so-called active region of the power semiconductor device. For example, within the active region, the one or more power cells are electrically connected to the front side load terminal.

The active region may be configured with a stripe pattern, according to which the power cells extend in a stripe like manner through the entire active region or substantial parts thereof, or the active region may be configured with a cellular/grid pattern, according to which the power cells exhibit a columnar design (also referred to as "needle design") and are distributed within the active region.

The present specification is directed to the latter case, i.e., to a die with an active region where the cells are arranged in accordance with a grid pattern. For example, in accordance with such grid pattern, gate trenches may form grid openings (e.g., grid meshes), and each grid opening may spatially confine one power cell. E.g., the gate trenches extend longitudinally, in the active region, along linear lines that perpendicularly cross each other. Further, in each grid opening, there may be arranged a columnar (e.g. needle) trench housing a columnar (e.g. needle) trench electrode connected to a different electrical potential as compared to gate electrodes in the gate trenches.

The power semiconductor die is laterally confined by a die edge, and between the die edge and the active region, there is usually arranged a so-called edge termination region. In terms of power semiconductor dies, such edge termination region is also referred to as a "high voltage termination structure", and it may serve the purpose of supporting the voltage handling capability of the power semiconductor die, e.g., by influencing the course of the electric field within the semiconductor die, e.g., so as to ensure reliable blocking capability of the power semiconductor die.

A reliable blocking capability is desirable. To this end, a respective field plate electrode may be arranged in one or more of the power cells.

On the other hand, a high density of power cells within the active region may be desirable in terms of handling high load currents at low conduction losses.

SUMMARY

In accordance with some embodiments described herein, it is proposed, at least for one of the power cells of a needle trench MOSFET, to include the field plate electrode in a columnar field plate trench which has a slim upper (proximal) portion close to a channel region of the power cell, and which increases in width along its extension in the vertical direction so to exhibit a thicker deep portion. Thereby, in upper portions of the semiconductor body the needle trench MOSFET (where the inversion channels are induced for conduction of the load current), a small cell pitch may be achieved and hence a high overall power cell density. At the same time, due to the increasing width of the columnar field plate trench, a sufficiently large field plate electrode can be included in the columnar field plate trench, hence ensuring reliable blocking capability.

In accordance with an embodiment, a power semiconductor die has a semiconductor body coupled to a first load terminal and a second load terminal of the power semiconductor die and configured to conduct a load current between the load terminals. The die further comprises: a control trench structure for controlling the load current, the control trench structure extending into the semiconductor body along a vertical direction and arranged in accordance with a horizontal grid pattern having a plurality of grid openings; a plurality of power cells, each power cell being, in a horizontal cross-section, at least partially arranged in a respective one of the plurality of grid openings. At least one of the power cells comprises: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a control section with at least one control electrode section in the control trench structure; a columnar field plate trench extending into the semiconductor body along the vertical direction and including a field plate electrode electrically coupled to the first load terminal, the columnar field plate trench having a deep portion below the channel zone section and a proximal portion above the deep portion, the proximal portion vertically overlapping with the channel zone section, wherein a deep horizontal width of the deep portion amounts to at least 110% of a proximal horizontal width of the proximal portion.

In accordance with another embodiment, a power semiconductor die has a semiconductor body coupled to a first load terminal and a second load terminal of the power semiconductor die and configured to conduct a load current between the load terminals. The die further comprises: a control trench structure for controlling the load current, the control trench structure extending into the semiconductor body along a vertical direction and arranged in accordance with a horizontal grid pattern having a plurality of grid openings; a plurality of power cells, each power cell being, in a horizontal cross-section, at least partially arranged in a respective one of the plurality of grid openings. Each power cell comprises: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a control section with at least one control electrode section in the control trench structure; a columnar field plate trench extending into the semiconductor body along the vertical direction and including a field plate electrode electrically coupled to the first load terminal. A horizontal distance between two columnar field plate trenches of two adjacent ones of the plurality of power cells decreases by at least 10% along the vertical direction.

In accordance with a further embodiment, a method of processing a power semiconductor die is presented. The power semiconductor die has a semiconductor body coupled to a first load terminal and a second load terminal of the power semiconductor die and configured to conduct a load current between the load terminals. The method comprises: forming a control trench structure for controlling the load current, the control trench structure extending into the semiconductor body along a vertical direction and arranged in accordance with a horizontal grid pattern having a plurality of grid openings; forming a plurality of power cells, each power cell being, in a horizontal cross-section, at least partially arranged in a respective one of the plurality of grid openings, and comprising: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; and a control section with at least one control electrode section in the control trench structure. The method further comprises forming, in at least one of the power cells, a columnar field plate trench extending into the semiconductor body along the vertical direction and including a field plate electrode electrically coupled to the first load terminal, the columnar field plate trench having a deep portion below the channel zone section and a proximal portion above the deep portion, the proximal portion vertically overlapping with the channel zone section, wherein a deep horizontal width of the deep portion amounts to at least 110% of a proximal horizontal width of the proximal portion.

In accordance with a yet further embodiment, a method of processing a power semiconductor die is presented. The power semiconductor die has a semiconductor body coupled to a first load terminal and a second load terminal of the power semiconductor die and configured to conduct a load current between the load terminals. The method comprises: forming a control trench structure for controlling the load current, the control trench structure extending into the semiconductor body along a vertical direction and arranged in accordance with a horizontal grid pattern having a plurality of grid openings; forming a plurality of power cells, each power cell being, in a horizontal cross-section, at least partially arranged in a respective one of the plurality of grid openings, and comprising: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; and a control section with at least one control electrode section in the control trench structure. The method further comprises forming, in each power cell, a columnar field plate trench extending into the semiconductor body along the vertical direction and including a field plate electrode electrically coupled to the first load terminal, wherein a horizontal distance between two columnar field plate trenches of two adjacent ones of the plurality of power cells decreases by at least 10% along the vertical direction.

Those skilled in the art will recognize additional features and advantages upon reading the following detailed description, and upon viewing the accompanying drawings.

BRIEF DESCRIPTION OF THE FIGURES

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein.

Further, in the context of the present specification, the term "in contact" intends to describe that there is a direct physical connection between two elements of the respective semiconductor device; e.g., a transition between two elements being in contact with each other may not include a further intermediate element or the like; i.e., said two elements may be in touch with each other.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

In this specification, n-doped is referred to as "first conductivity type", while p-doped is referred to as "second conductivity type". Alternatively, opposite doping relations can be employed so that the first conductivity type can be p-doped and the second conductivity type can be n-doped.

Specific embodiments described in this specification pertain to, without being limited thereto, a power semiconductor die, e.g., a power semiconductor die that may be used within a power converter or a power supply. For example, the power semiconductor die described herein is configured to be employed within a power rectifier or within a power inverter, e.g., within a synchronous power rectifier or power inverter. For example, such rectifier/inverter is used as a part of a motor drive. Thus, in an embodiment, the power semiconductor die described herein can be configured to carry a part of a current that is to be fed to a load and/or, respectively, that is provided by a power source.

Accordingly, the term "power semiconductor die" as used in this specification intends to describe a single die with high voltage blocking and/or high current-carrying capabilities. In other words, such power semiconductor die is intended for high current, typically in the Ampere range, e.g., up to 5 or 300 Amperes, and/or voltages typically above 15 V, more typically up to 400 V, and above, e.g., up to at least 500 V or more than 500 V, e.g. at least 600 V. Further, the power semiconductor die described herein can be configured for high switching frequencies, e.g., for a switching frequency of at least 100 kHz and up to 2 MHz.

For example, the power semiconductor die described below may be a die that is configured to be employed as a power component in a low-, medium- and/or high voltage application.

Further, the term "power semiconductor die" as used in this specification is not directed to logic semiconductor devices that are used for, e.g., storing data, computing data and/or other types of semiconductor based data processing.

For example, the die may comprise one or more active power cells, such as a monolithically integrated transistor cell, e.g., a monolithically integrated MOSFET cell and/or derivatives thereof. A plurality of such power cells may be integrated in the die.

In accordance with the embodiments described herein, the power semiconductor die includes power cells which are of the columnar/needle type. For example, the power cells are not of the stripe type. The columnar/needle type cells can each comprise at least one columnar trench, e.g., a columnar field plate trench. For example, in accordance with such columnar/needle configuration, the total lateral extensions of each columnar/needle power cell along each of the first lateral direction X and the second lateral direction Y amount to only a fraction of the total lateral extensions along the first lateral direction X and the second lateral direction Y of the power semiconductor die. For example, the total lateral extension of a respective columnar/needle cell amounts to less than 1%, or to even less than 0.05% of the total extension of the power semiconductor die along one of the first lateral direction X and the second lateral direction Y. For example, a die with a side length of approx. 4 mm along the first lateral direction X and a typical cell pitch of approx. 2 µm leads to total lateral extension of a respective columnar/needle cell of approx. 2/4000=0.05% of the total extension of the die along the first lateral direction X. Further, each columnar/needle cell can exhibit, in parallel to the XY-plane, a rectangular, e.g., a quadratic horizontal cross-section, e.g., a rectangular horizontal cross-section with rounded corners, or an elliptical horizontal cross-section, or a circular horizontal cross-section, or a polygonal, e.g., an octagonal or a hexagonal horizontal cross-section. The course of such cross-sections may be defined by means of grid pattern of control trench structure, as will become more apparent from the description of the drawings.

In an embodiment, each columnar/needle power cell has a maximum lateral extension and a maximum vertical extension, wherein the maximum lateral extension is smaller than ½, ⅓, ¼ or ⅕ of the maximum vertical extension or even yet smaller than ⅙ of the maximum vertical extension. E.g., the maximum vertical extension is defined by the total extension of the columnar field plate trench (as mentioned below) along the vertical direction of the respective columnar/needle power cell.

In the following, the term power cell refers to a columnar/needle power cell, e.g., as exemplarily defined above.

As used herein, the term "needle" includes but is not limited to designs according to which a trench bottom is tapered (like a needle); rather, the term "needle" also includes those designs according to which the trench bottom is substantially flat, e.g., extends horizontally.

Figure 1:
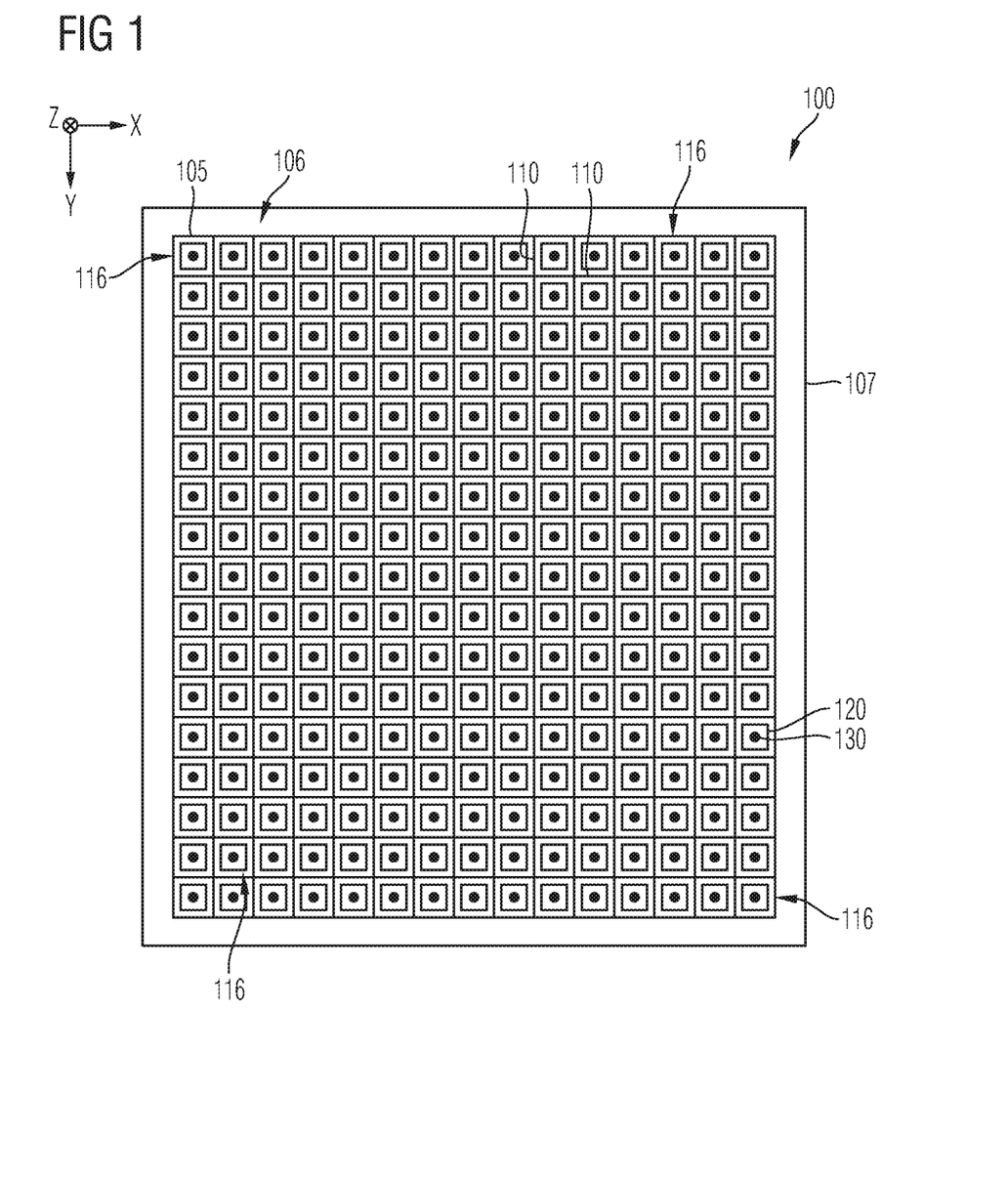
FIG. 1 schematically and exemplarily illustrates a section of a horizontal projection of a power semiconductor die in accordance with one or more embodiments.
Figure 2:
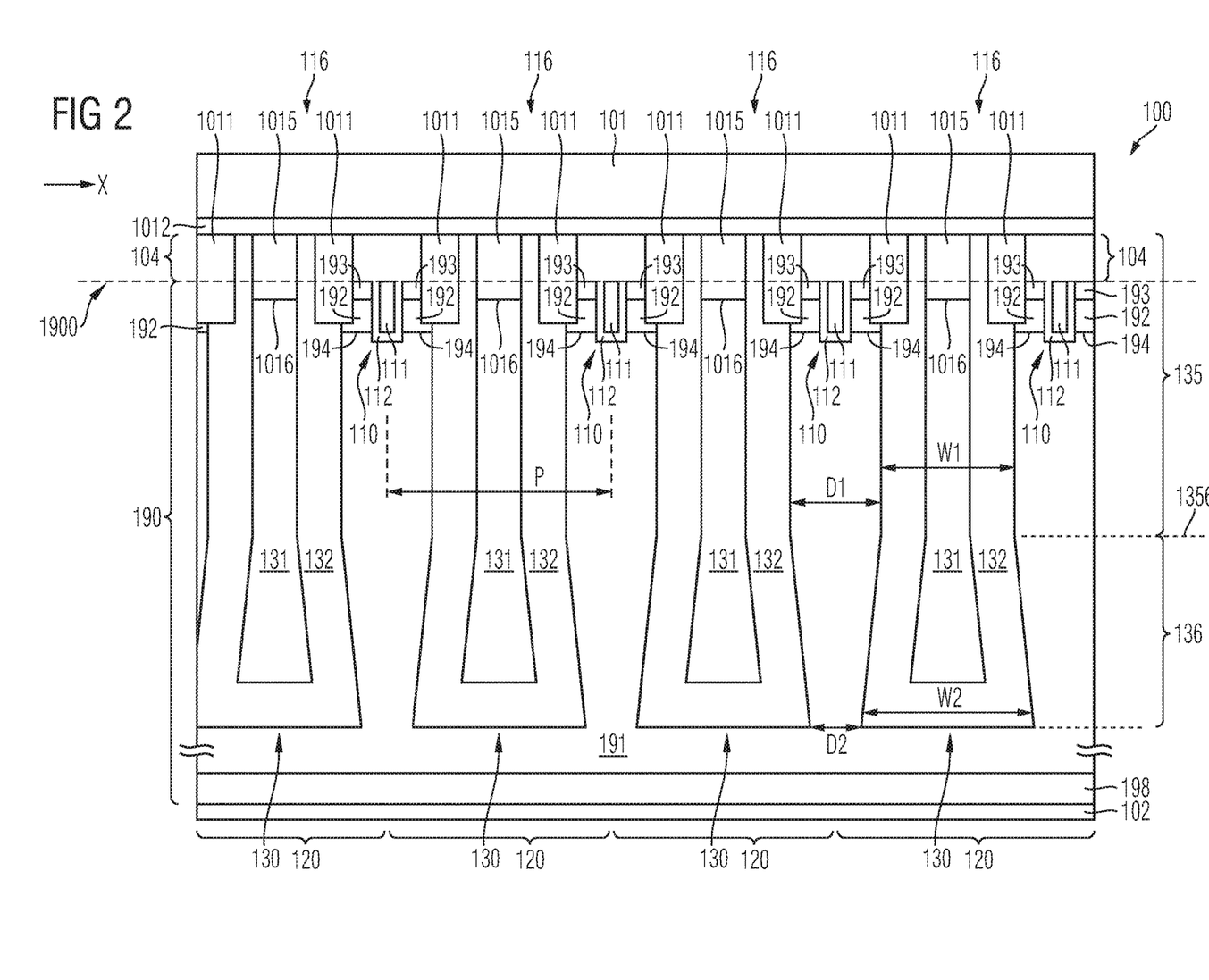
FIG. 2 schematically and exemplarily illustrates a section of a vertical cross-section of a power semiconductor die in accordance with one or more embodiments.

FIG. 1 schematically and exemplarily illustrates a section of a horizontal projection of a power semiconductor die 100 in accordance with one or more embodiments. FIG. 2 schematically and exemplarily illustrates a section of a vertical cross-section of the power semiconductor die 100 in accordance with one or more embodiments. In the following, it will be referred to both FIG. 1 and FIG. 2.

The power semiconductor die has a semiconductor body 190 coupled to a first load terminal 101 and a second load terminal 102 of the power semiconductor die 100. The die 100 can be MOSFET and, hence, the first load terminal 101 may be a source (emitter) terminal and the second load terminal 102 may be a drain (collector) terminal.

The first load terminal 101 may be arranged at a front side of the die 100, and the second load terminal 102 may be arranged at a backside of the die 100. The front side of the die 100 may be in proximity to an upper surface 1900 of the semiconductor body 190. For example, the first load terminal 101 includes a front side metallization, and the second load terminal 102 includes a backside metallization.

The semiconductor body 190 is configured to conduct a load current between the load terminals 101, 102, e.g., a load current of at least 5 A, 10 A, of at least 50 A or of even more than 100 A.

The die 100 includes a control trench structure 110 for controlling the load current. The control trench structure 110 extends into the semiconductor body 190 along the vertical direction Z and is arranged in accordance with a horizontal grid pattern 115 having a plurality of grid openings 116, as illustrated in FIG. 1.

The control trench structure 110 may comprise a control electrode 111 that is electrically insulated from that semiconductor body 190, e.g., by means of a control trench insulator 112. The control electrode 111 may be coupled to an output of a driver unit (not illustrated) and, responsive to a control signal received via the output, set the die 100 in one of the conducting state, during which the load current is conducted between the load terminals 101 and 102, and the blocking state, during which a positive forward voltage is blocked between the load terminals 101 and 102 and flow of the load current is inhibited, the positive forward voltage being present if the electrical potential of the second load terminal 102 is greater than the electrical potential of the first load terminal 101.

For conduction of the load current, the die 100 comprises a plurality of power cells 120. For example, these power cells 120 are arranged within an active region 105 of the power semiconductor die 100. A die edge 107 laterally terminates the die 100, and an edge termination region 106 is arranged between the die edge 107 and the active region 105. For example, the edge termination region 106 is not configured for conduction of the load current.

The control trench structure 110 extends mainly within the active region 105 and, there, into the semiconductor body 190 along the vertical direction Z, e.g., for a distance of at least 500 nm, at least 600 nm, or at least 700 nm, wherein the extension of the control trench structure 110 along the vertical direction Z may, e.g., be chosen in dependence of the designated maximum blocking voltage of the die 100.

The grid pattern 115 with the plurality of the grid openings 116 defines subregions within the active region 105. For example, each grid opening 116 is associated with one of the plurality of power cells 120.

The grid openings 116 are illustrated as exhibiting rectangular horizontal circumference, wherein it shall be understood that the present specification is not limited to such horizontal circumferences; e.g., in another embodiment, the grid openings 116 may exhibit a circular or ellipsoidal circumference or rectangular circumference with rounded corners. It shall further be understood that the grid openings 116 must not necessarily be completely surrounded by the respective part of the grid pattern 115. For example, depending on the design of the control trench structure 110, there may be small gaps (not illustrated), for example, at intersection points between intersecting stripes of the control trench structure 110.

For example, each grid opening 116 exhibits a maximal horizontal extension of no more than a few micrometer, e.g., of no more than 5 µm or of no more than 2 µm. For example, such maximal horizontal extension may be the width of the respective grid opening 116 along the first lateral direction X or the length along the second lateral direction Y, whichever is greater.

Accordingly, each power cell 120 is, in a horizontal cross-section, at least partially arranged in a respective one of the plurality of grid openings 116.

FIG. 2 shows an exemplary configuration of four adjacent grid openings 116, each being associated with one power cell 120.

For example, all power cells 120 have the same configuration. In another embodiment, the power cells 120 may differ in configuration; e.g., it is possible that the active region 105 includes power cells of a first type and power cells of a second type and, optionally, even one or more cells of a further type, e.g., auxiliary cells or dummy cells. The following description refers to the case where at least the power cells 120 are substantially identically configured, wherein, as pointed out, it should be understood that this must not necessarily be the case. Rather, the power cells 120 may also differ from each other.

Each power cell 120 comprises a drift zone section 191 of the first conductivity type, a channel zone section 192 of the second conductivity type and a source zone section 193 of the first conductivity type. The channel zone section 192 isolates the source zone section 193 from the drift zone section 191, wherein the source zone section 193 is electrically connected to the first load terminal 101. Also, the channel zone section 192 may be electrically connected to the first load terminal 101. For example, for implementing said electrical connection, first contact plugs 1011 may be employed. E.g., these contact plugs 1011 penetrate the first insulation layer 1012 (said penetration not being illustrated in FIG. 2) and the second insulation layer 104. For example, in each power cell 120, the source zone section 193 and the channel zone section 192 are arranged in contact with the respective first contact plug 1011.

Figure 3A:
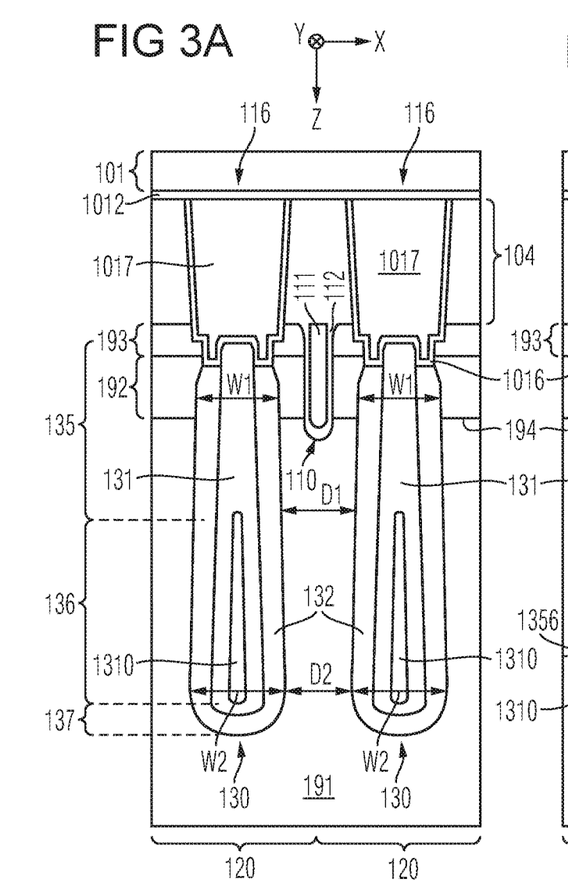
FIGS. 3A-3C each schematically and exemplarily illustrate a section of a vertical cross-section of a power semiconductor die in accordance with some embodiments.
Figure 3B:
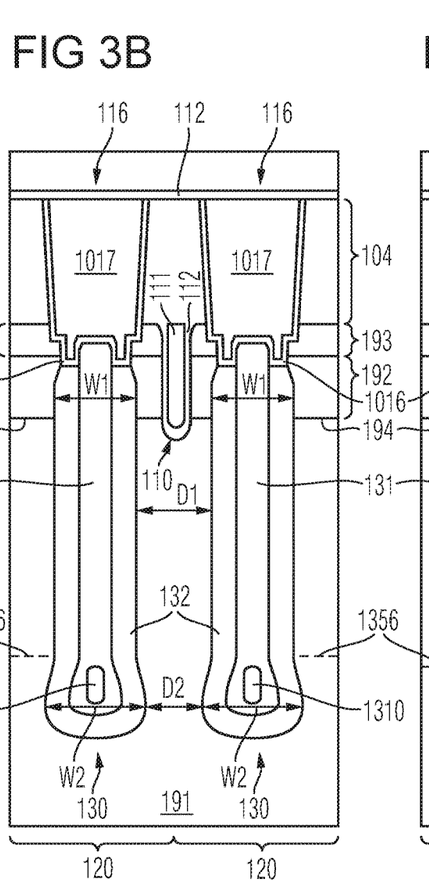
Figure 3C:
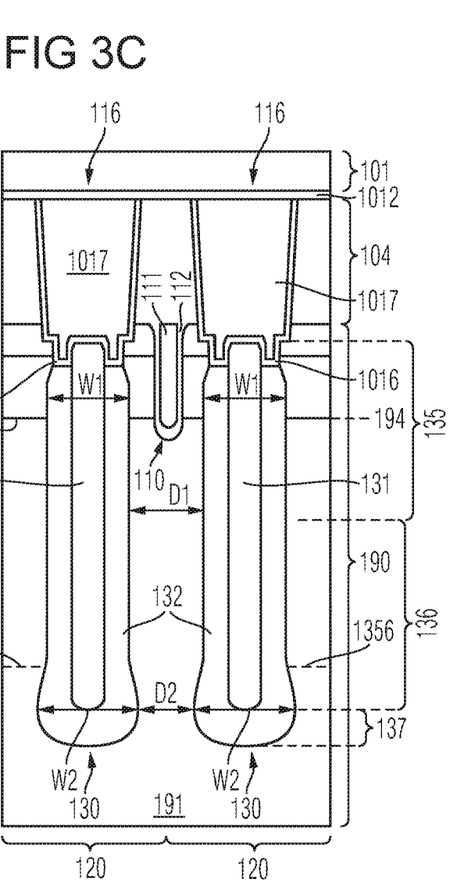

As more clearly illustrated in FIGS. 3A-C, the source zone 193 and the channel zone 192 may contiguously extend within the semiconductor body 190, e.g., into each of the power cells 120. Hence, with respect to a respective power cell 120, the formulations "source zone section" and "channel zone section" have been chosen. The same applies to the drift region (section) 191.

A transition between the channel zone 192 and the drift zone 191 forms a pn-junction 194. For example, the drift zone 191 forms the major portion of the semiconductor body 190 and extends along the vertical direction Z until it interfaces with a doped contact region 198 which is electrically connected to the second load terminal 102. The doped contact region 198 may contiguously extend along the lateral directions X and Y so as to form the homogeneous semiconductor layer that horizontally (i.e., along the lateral directions X and Y) overlaps with all power cells 120. For example, the doped contact region 198 comprises or is a field stop layer of the first conductivity type, e.g., the same conductivity type as the drift region 190, but having a higher dopant concentration.

Each power cell 120 further comprises a control section with at least one control electrode section 111 included in the control trench structure 110, as has already been indicated above. The control electrode sections 111 are electrically insulated from each of the first load terminal 101, the second load terminal 102 and the semiconductor body 190.

Regarding the components control electrode section 111, source zone section 193, channel zone section 192 and drift zone section 191, the principal configuration of each power cell 120 corresponds to the typical MOSFET configuration, according to which the control electrode section 111 may induce, upon receiving a corresponding turn-on control signal, an inversion channel within the channel zone section 192, and, upon receiving a corresponding turn off control signal, cut-off this inversion channel. The general operation principle is described in a little more detail further below; however, it is such known to the skilled person and the embodiments described herein do not deviate from this general operation principle.

The control electrode sections 111 of the power cells 120 may be formed by a respective monolithic stripe control electrode, these stripe electrodes being included in the stripes of the control trench structure 110 as illustrated in FIG. 1. Hence, it shall also be understood that a specific control electrode section 111 may be associated with two adjacent power cells 120, as illustrated in FIG. 2. In other words, each power cell 120 may for example be controlled by means of four control electrode sections 111 that surround the source zone section 193 and the channel zone section 192 of the respective power cell 120.

The control electrode sections 111 may vertically overlap with both the source zone section 193 and the channel zone section 192. In other words, in each power cell 120, the at least one control electrode section 111 and the source zone section 193 may exhibit a first common extension range along the vertical direction Z, e.g., of 100 nm, and the at least one control electrode section 111 the channel zone section 192 may exhibit a second common extension range along the vertical direction Z, e.g., of 50 nm. Further, the at least one control electrode section 111 may extend at least as deep as said pn-junction 194.

Each power cell 120 may further comprise a columnar field plate trench 130 extending into the semiconductor body 190 along the vertical direction Z and including a field plate electrode 131 electrically coupled to the first load terminal 101.

For example, the field plate electrodes 131 are electrically connected to the first load terminal 101, e.g., such that the electrical potential of the field plate electrodes 131 is substantially identical to the electrical potential of the first load terminal 101. For example, to implement the electrical connection, second contact plugs 1015 may be employed that extend from the first load terminal 101 down into the field plate trenches 130 so as to contact the field plate electrodes 131. For improving the contact, electrically conductive adhesion promoters 1016 may be used, as illustrated. In another embodiment, the field plate electrodes 131 may be electrically coupled to the first load terminal 101 by means of an ohmic resistor.

Regarding the contact plugs 1011 and 1015, it shall be understood that, as illustrated in FIGS. 3A-C, it is additionally or alternatively possible to electrically connect the first load terminal 101 to both the source zone section 193 and the field plate electrode 131 by means of a joint contact plug 1017. For example, the electrical connection of each power cell 120 to the first load terminal 101 can be effected by means of a respective single joint contact plug 1017, in accordance with an embodiment.

In contrast to the common name "field plate electrode", the field plate electrodes 131 do typically not exhibit the shape of a plate, but rather of a column/needle, as also illustrated in FIGS. 1 and 2.

In each field plate trench 130, a trench insulator 132 may be provided that insulates the respective field plate electrode 131 from the semiconductor body 190.

For example, the total vertical extension of each columnar field plate trench 130 amounts to at least twice of the total vertical extension of the control trench structure 110; e.g., each columnar field plate trench 130 extends at least three times as far along the vertical direction Z as compared to the control trench structure 110, e.g., taking the upper surface 1900 of the semiconductor body 190 as a reference.

The columnar field plate trenches 130 may be considered to comprise a respective deep portion 136 below the channel zone section 192 and a proximal portion 135 above the deep portion 136.

Along the vertical direction Z, the proximal portion 135 can join seamlessly into the deep portion 136, as illustrated in FIG. 2. This may, e.g., yield that the two portions 135 and 136 are not coupled to each other by means of a coupling component or the like, but that both portions 135 and 136 jointly form the respective columnar field plate trench 130. For example, the columnar field plate trench 130 exhibits a total extension along the vertical direction Z, and the proximal portion 135 includes the upper third of this total extension, and the deep portion 136 the remaining two thirds of this total extension. It shall be understood that, in contrast to the schematic illustration in FIG. 2, the columnar field plate trench 130 must not necessarily be terminated by the deep portion 136, but that the columnar field plate trench 130 may comprise a bottom portion 137 that terminates the columnar field plate trench 130 along the vertical direction Z (cf. FIGS. 3A-C and FIG. 4B).

For example, the proximal portion 135 vertically overlaps with the channel zone section 192. In an embodiment, the channel zone section 192, the control electrode section 111 and the proximal portion 135 exhibit a common vertical extension range, e.g., of at least 200 nm. The proximal portion 135 may include a section of the field plate electrode 131, as will be explained in more detail below.

The proximal portion 135 has a proximal horizontal width W1, and the deep portion 136 has a deep horizontal width W2, wherein it shall be understood that these horizontal widths W1 and W2 must not necessarily be constant along the vertical direction Z.

In accordance with one or more embodiments, it is proposed to increase the width of the columnar field plate trenches 130 as they extend along the vertical direction Z. For example, a maximum of the deep horizontal width W2 is always greater than a maximum of the proximal horizontal width W1.

For example, the (maximal) deep horizontal width W2 of the deep portion 136 amounts to at least 110% of the (maximal) proximal horizontal width W1 of the proximal portion 135.

Additionally or alternatively, a horizontal distance between two columnar field plate trenches 130 of two adjacent ones of the plurality of power cells 120 decreases along the vertical direction Z (cf. distances D1 and D2 in FIG. 1), e.g., by at least 10%, wherein the horizontal distance is measured between the trench insulators 132 of the adjacent columnar field plate trenches 130, e.g., between the sidewalls of the adjacent columnar field plate trenches 130.

For example, the distance D1 between two adjacent proximal portions 135 may be within the range of, e.g., 500 to 700 nm, and the distance D2 between two adjacent deep portions 136 may be within the range of, e.g., 300 to 500 nm.

In the following, a plurality of examples will be presented of how such increase of the width of the columnar field plate trench 130 may be implemented.

Figure 4A:
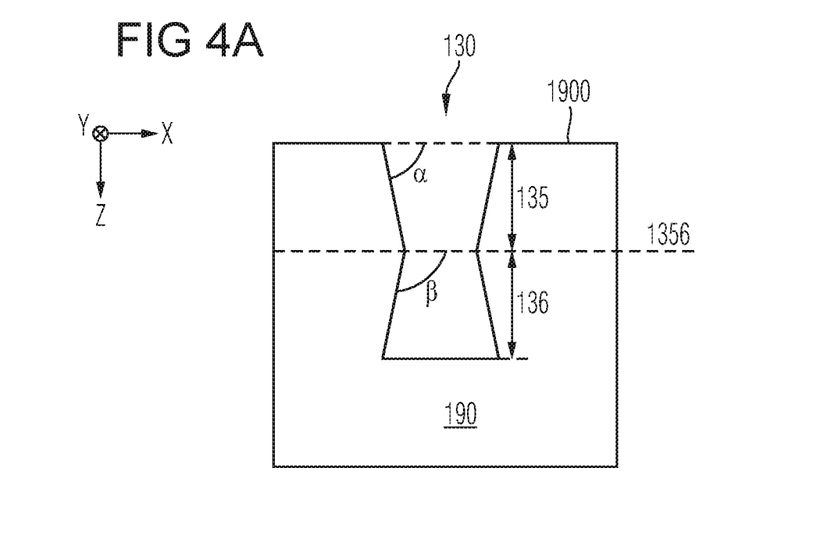
FIGS. 4A-4B each schematically and exemplarily illustrate a section of a vertical cross-section of a power semiconductor die in accordance with some embodiments.
Figure 4B:
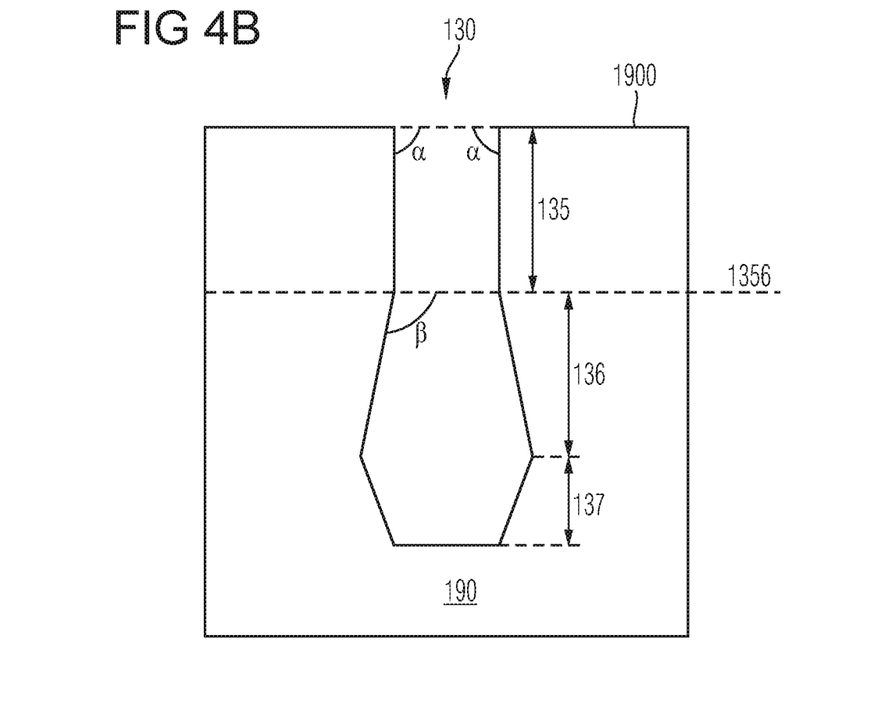

For example, at least in a subportion of the proximal portion 135, a rate of change of the proximal width (i.e., dW1/dZ) with respect to the vertical direction Z is either substantially zero or even negative. E.g., the proximal portion 135 may be comparatively slim and the proximal horizontal width W1 does not substantially increase within the proximal portion 135, but remains rather constant or, respectively, even decreases (cf. FIG. 4A). As indicated above, the proximal portion 135 may include the upper third of the total extension of the columnar field plate trench 130 along the vertical direction Z. The subportion may include at least that section of the proximal portion 135 that vertically overlaps with control trench structure 110.

For example, the increase in horizontal width starts at a threshold level 1356. For example, the columnar field plate trench 130 does substantially not increase in horizontal width until this threshold level 1356 is reached, as illustrated in FIG. 2. In another embodiment, the columnar field plate trench 130 also increases (e.g., only slightly) in width within its proximal portion 135, e.g., as illustrated in FIG. 3.

If present, the threshold level 1356 may be arranged within the deeper half of the columnar field plate trench 130.

The total vertical extension of the deep portion 136 can amount to at least 10% of the total vertical extension of the columnar field plate trench 130. As indicated, that share can be greater than 10%, e.g., greater than 30%, greater than 50%, greater than 66.67% (corresponding to two thirds), or even greater than 90%.

Further, along the entire total extension along the vertical direction Z of the deep portion 136, or along at least a part thereof, e.g., a part of at least 50%, the rate of change of the deep horizontal width (i.e., dW2/dZ) with respect to the vertical direction Z is either zero or positive. Hence, also a step-like increase (not illustrated) of the horizontal width of the columnar field plate trench 130 is possible; e.g., this allows dW2/dZ to be substantially zero or, at least in a subportion, even negative within the deep portion 136. As pointed out above, and as illustrated in each of FIGS. 2 to 4A, the increase in horizontal width typically occurs rather gradually, e.g., depending on the process, linearly or exponentially.

The rate of change of the proximal horizontal width dW1/dZ can be defined by a first angle α (e.g., with respect to the upper surface 1900 of the semiconductor body 190), and the rate of change of the deep horizontal width dW2/dZ can be defined by second angle β (e.g., also with respect to the upper surface 1900 of the semiconductor body 190).

In an embodiment, the second angle β is greater than the first angle α. For example, in the proximal portion 135, the first angle α is within the range of 60° to 100°. In the deep portion 136, the second angle β can be within the range of 91° to 150°. Further, at least one of the second angle β and the first angle α may be substantially constant. The transition from the proximal portion 135 to the distal portion 136 (e.g., where the difference between the angles β and α is established) may be formed at or (gradually) in proximity to the threshold level 1356.

In another embodiment, the second angle β and the first angle α may be substantially identical to each other (cf. FIG. 3A), e.g., both amounting to at least 92°, to at least 95° or to even more than 100°.

As indicated above, in contrast to the schematic illustration in FIG. 2, the columnar field plate trench 130 must not necessarily be terminated by the deep portion 136, but the columnar field plate trench 130 may comprise said bottom portion 137 that terminates the columnar field plate trench 130 along the vertical direction Z (cf. FIGS. 3A-C and FIG. 4B). The total vertical extension of the bottom portion 137 may depend on the applied process, and in the bottom portion 137, the width of the columnar field plate trench 130 (naturally) decreases.

For example, a horizontal width of each columnar field plate trench 130 changes, e.g., in accordance with a constant rate of change along the vertical direction Z, for at least 40% of the total vertical extension of the respective columnar field plate trench 130 (cf. FIG. 2), wherein this share can be even greater than 40%, e.g., greater than 70% or may even amount to about 100% (cf. FIG. 3A).

In another embodiment, e.g., as illustrated in FIGS. 3B and 3C, the horizontal width of each columnar field plate trench 130 remains substantially constant along the vertical direction for at least 70% of the total vertical extension of the respective columnar field plate trench 130.

For example, the increase in horizontal width occurs, e.g., exclusively, within the deepest tenth part of the respective columnar field plate trench.

Still referring to FIGS. 3B and 3C, in an embodiment, an increase of at least 10% of the horizontal width of each columnar field plate trench 130 occurs along no more than 30% of the total vertical extension of the respective columnar field plate trench 130. Further, said no more than 30% of the total vertical extension of the respective columnar field plate trench 130 can form a section of or the deepest part of the respective columnar field plate trench 130.

As indicated, the deep portion 136 can form, e.g., alone or together with said bottom portion 137, a distal portion that terminates the columnar field plate trench 130 along the vertical direction Z. E.g., said distal portion includes no more than 30% of the total vertical extension of the respective columnar field plate trench 130 where the increase in horizontal width of at least 10% occurs. However, the exemplarily mentioned value of no more than 30% of the total vertical extension of the respective columnar field plate trench 130 may also be different in other embodiments, e.g., depending on the applied process. E.g., the increase in width may also occur (e.g., linearly) along the total vertical extension of the respective columnar field plate trench 130 (in which case said "30%-limitation" would not apply) or, in another embodiment, exclusively in the deep portion 136.

Irrespective of how the horizontal width increase is implemented, e.g., irrespective of how the angles β and α or chosen, it shall be ensured that the (maximal) deep horizontal width W2 of the deep portion 136 amounts to at least 110% or to at least 120% of the (maximal) proximal horizontal width W1 of the proximal portion 135 and/or that horizontal distance between two columnar field plate trenches 130 of two adjacent ones of the plurality of power cells 120 decreases by at least 10% or by at least 20% along the vertical direction Z, as indicated above. At the same time, it shall be ensured that the minimum distance D2 (cf. FIGS. 2 and 3A-C) between two adjacent columnar field plate trenches 130 is greater than zero, e.g., greater than 350 nm. Further, generally, it may be appropriate to effect the increase of the horizontal width of the columnar field plate trench 130 in a rather deep and short portion of the columnar field plate trench 130 so as to minimize a reduction of the area between two adjacent columnar field plate trenches 130 (i.e., the mesa area) and to thereby allow for a low on-state resistance. Thus, in an embodiment and as described above, the deep portion 136 forms, at least partially, a distal portion that terminates the columnar field plate trench 130 along the vertical direction Z, wherein, in an embodiment, the distal portions includes no more than 30% of the total extension of the columnar field plate trench 130.

The description above was primarily directed to the increasing width of the respective entire columnar field plate trench 130. Each columnar field plate trench 130 comprises or, respectively, essentially consists of the field plate trench electrode 131 and the trench insulator 132. For example, at least one of a horizontal width of the field plate electrode 131 (i.e., the distance between its outer sidewalls) and a horizontal thickness of the field insulator 132 (i.e., the distances between the columnar field plate trench sidewalls and the outer sidewalls of the field plate electrode) increases along the vertical direction Z.

As will become apparent from the following description, the horizontal width increase of the columnar field plate trench 130 may be achieved by either only a corresponding increase in horizontal width of the trench insulator 132, only a corresponding increase in horizontal width of the field plate electrode 131, or by a corresponding increase of both the horizontal width of the trench insulator 132 and the horizontal width of the field plate electrode 131, wherein, regarding all options, the increase of horizontal width of the trench insulator 132 must not necessarily be identical to the increase of horizontal width of the field plate electrode 131.

Generally, the field plate electrode 131 may extend into both the proximal portion 135 and the deep portion 136 and also, if present, into the bottom portion 137.

For example, regarding the embodiment of FIGS. 2 and 3C, the horizontal width of the field plate electrode 131 may be substantially constant along the vertical direction Z. E.g., in accordance with these embodiments, only the horizontal width of the trench insulator 132 increases along the vertical direction Z. In other words, in an example, the increase of the horizontal width of the columnar field plate trench 130 is effected essentially only by means of the increase of the horizontal width of the trench insulator 132. As already mentioned above, such increase may start at the threshold level 135b, as illustrated in both FIG. 2 and FIG. 3C, and, e.g., for no more than 30% of the total vertical extension of the columnar field plate trench 130, as more clearly illustrated in FIG. 3C.

Regarding the embodiment of FIGS. 3A-B, the horizontal width (i.e., the thickness) of the trench insulator 132 may remain substantially constant, wherein the field plate electrode 131 increases in horizontal width along the vertical direction Z. For example, the field plate electrode 131 has a maximum horizontal width in a section that forms a part of the deep portion 136 of the columnar field plate trench 130. As has already been explained more generally with respect to the width increase of the columnar field plate trench 130, the width increase of the field plate electrode 131 may occur along more than 50% of the total extension of the columnar field plate trench 130, e.g., along more than 80% of the total extension. For example, along its entire extension along the vertical direction Z, the field plate electrode 131 may increase in horizontal width, e.g., by at least 10%. Such gradual increase along the substantial part of the columnar field plate trench 130 is schematically and exemplarily illustrated in FIG. 3A. In another embodiment, the horizontal width of the field plate electrode 131 remains substantially constant for at least 70% of its total extension along the vertical direction Z, wherein said at least 70% may form the proximal (i.e., upper) portion of the field plate electrode 131. Hence, in an embodiment, the width increase may occur along no more than 30% (e.g., the deeper portion) of the field plate electrode 131, wherein such embodiment is schematically and exemplarily illustrated in FIG. 3B.

As has become clear from the aforesaid, the increase of the horizontal width of the columnar field plate trench 130 may occur in the deep portion 136, e.g., such that the deep horizontal width W2 (which is greater than 110% of the proximal horizontal width W1) is present within the deepest two tenth parts of the columnar field plate trench 130, wherein these deepest two tenth parts may also include the bottom portion 137. For example, by effecting the horizontal width increase of the columnar field plate trench 130 by either increasing the horizontal widths of both the field plate electrode 131 and the trench insulator 132 or by increasing only one of these horizontal widths, the effective thickness of the trench insulator 132 in the bottom portion 137 may also be adjusted, i.e., the distance between the drift region 191 and the field plate electrode 131. Also, the effective area of the field plate electrode 131 that faces to the second load terminal 102 may be correspondingly adjusted, wherein, for example, an increase of the width of the field plate electrode 131 may yield an increase of said effective area. For example, by this means, a total output capacitance of the semiconductor die 100 may be adjusted.

E.g., in terms of adjustment of the total output capacitance, it may be appropriate that the columnar field plate trench width increase is reflected by a corresponding increase of the width of the field plate trench electrode, e.g., as schematically illustrated in FIG. 2 and in sections (A) and (B) of FIG. 3. Hence, in accordance with an embodiment, the width increase as described with respect to the columnar field plate trench 130 may equally apply to an increase in width of the field plate electrode 131. E.g., a deep horizontal width of the field plate electrode 131 in the deep portion 136 can amount to at least 110% of a proximal horizontal width of the field plate electrode 131 in the proximal portion 135. For example, the thickness of the trench insulator 132 may remain substantially constant along the total vertical extension of the columnar field plate trench 130, in accordance with an embodiment.

In accordance with one or more embodiments, the field plate electrode 131 may exhibit a void volume section 1310. For example, such void volume section 1310 may come into being during the manufacturing process, e.g., if such process is configured such that an increase of the horizontal width of the field plate electrode 131 be achieved. This is exemplarily and schematically illustrated in FIGS. 3A-B.

In an embodiment, the void volume section 1310 extends into the deep portion 136, but not into the proximal portion 135. For example, thereby, a reliable electrical connection between the first load terminal 101 and the field plate electrode 131 can be achieved.

The form of the void volume section 1310 may correlate with the manner of how the increase of the horizontal width of the field plate electrode 131 is implemented. As indicated, if no increase of the horizontal width of the field plate electrode 131 is desired (e.g., as illustrated in FIG. 2 and FIG. 3C) then the void volume section 1310 typically does not come into being, wherein this is, of course, not excluded. If the increase of the horizontal width of the field plate electrode 131 is effected within a comparatively small distance along the vertical direction Z, as illustrated in FIG.

3B, and the total extensions of the void volume section 1310 along the first lateral direction X and the vertical direction Z may be within the same order of magnitude. If the increase of the horizontal width is effected within a comparatively long distance along the vertical direction Z, as illustrated in FIG. 3A, the total extension of the void volume section 1310 along the vertical direction Z may be significantly larger as compared to its total extension along the first lateral direction X.

In an embodiment, a minimum distance along the vertical direction Z between the pn-junction 194 and the void volume section 1310 is greater than zero and amounts to, e.g., at least 400 nm, to at least 600 nm, or to even more than 1000 nm.

Herein presented are also embodiments of a method of processing a power semiconductor die. The power semiconductor die has a semiconductor body coupled to a first load terminal and a second load terminal of the power semiconductor die and configured to conduct a load current between the load terminals.

The method comprises: forming a control trench structure for controlling the load current, the control trench structure extending into the semiconductor body along a vertical direction and arranged in accordance with a horizontal grid pattern having a plurality of grid openings; forming a plurality of power cells, each power cell being, in a horizontal cross-section, at least partially arranged in a respective one of the plurality of grid openings, and comprising: a section of a drift zone of a first conductivity type, a section of a channel zone of a second conductivity type and a section of a source zone of the first conductivity type, wherein the channel zone section is electrically connected to the first load terminal and isolates the source zone section from the drift zone section; and a control section with at least one control electrode section in the control trench structure.

The method may comprise forming, in at least one of the power cells, a columnar field plate trench extending into the semiconductor body along the vertical direction and including a field plate electrode electrically coupled to the first load terminal, the columnar field plate trench having a deep portion below the channel zone section and a proximal portion above the deep portion, the proximal portion vertically overlapping with the channel zone section, wherein a deep horizontal width of the deep portion amounts to at least 110% of a proximal horizontal width of the proximal portion.

Additionally or alternatively, the method further comprises forming, in each power cell, a columnar field plate trench extending into the semiconductor body along the vertical direction and including a field plate electrode electrically coupled to the first load terminal, wherein a horizontal distance between two columnar field plate trenches of two adjacent ones of the plurality of power cells decreases by at least 10% along the vertical direction.

Embodiments of a method described above may correspond to the embodiments of the power semiconductor die 100 that have been described with respect to FIGS. 1 to 4B. Hence, regarding exemplary embodiments of the methods, may be fully referred to the above.

In particular, it shall be understood that the sequence of executing the individual method steps may be appropriately chosen by the skilled person. E.g., in one embodiment, the control trench structure is formed before forming the columnar field plate trenches. In another embodiment, the control trench structure is formed after forming the columnar field plate trenches.

In more general terms, in the above, an embodiment of a semiconductor die 100 has been presented that may include a semiconductor substrate (e.g., semiconductor body 190) with gate trenches (e.g., control trench structure 110) extending into the front surface (e.g., upper surface 1900) of the semiconductor substrate. The semiconductor substrate can comprise any type of semiconductor material such as a single element semiconductor (e.g., Si, Ge, etc.), silicon-on-insulator, a binary semiconductor (e.g., SiC, GaN, GaAs, etc.), a ternary semiconductor, etc. with or without epitaxial layer(s). A gate electrode (e.g., control electrode sections 111) and a gate dielectric (e.g., trench insulator 112) are disposed in each gate trench, the gate dielectric separating the corresponding gate electrode from the semiconductor substrate. A field plate (e.g., field plate electrode 131) can be disposed in columnar field plate trenches 130, each field plate being separated from the semiconductor substrate and the corresponding gate electrode by a field dielectric (e.g., trench insulator 132) that is, e.g., thicker than the gate dielectric. Alternatively or additionally, field plates can be disposed in trenches that house also the gate electrodes.

A first (source/emitter) region (e.g. source zone 193) having a first conductivity type (e.g. n-type in the case of an n-channel device, or p-type in the case of a p-channel device) is formed in the semiconductor substrate at the front surface and adjacent each gate trench. A second (body) region (e.g. channel zone 192) having a second conductivity type (e.g. p-type in the case of an n-channel device, or n-type in the case of a p-channel device) is formed in the semiconductor substrate below the source/emitter region and adjacent each gate trench. A third (drift) region (e.g. drift zone 191) having the first conductivity type is formed in the semiconductor substrate, e.g. as part of an epitaxial layer, below the body region and adjacent each gate trench. A drain/collector region (cf. doped contact region 198) of the first conductivity type is formed at the back surface of the semiconductor substrate opposite the front surface, and is doped more heavily than the drift region. Further, in particular in case another material than Si is used, one could also imagine a pnp instead of an npn MOSFET.

The semiconductor die illustrated can be a vertical power MOSFET which has a channel zone that extends in the vertical direction Z along gate dielectric (cf. 112) in the body region (cf. 192). By applying a sufficient gate voltage to the gate electrodes, minority carriers (electrons in the case of a p-type body region, or holes in the case of an n-type body region) collect along the gate dielectric in the channel region and an electrically conductive path is completed between the source/emitter region and the drain/collector region via the drift and channel regions.

In accordance with some embodiments described herein, it is proposed, at least for one of the power cells of a needle trench MOSFET, to include the field plate electrode in a columnar field plate trench which has a slim upper (proximal) portion close to a channel region of the power cell, and which increases in width along its extension in the vertical direction so to exhibit a thicker deep portion. Thereby, in upper portions of the semiconductor body the needle trench MOSFET (where the channel regions are induced for conduction of the load current), a small cell pitch P may be achieved and hence a high overall power cell density. At the same time, due to the increasing width of the columnar field plate trench, a sufficiently large field plate electrode can be included in the columnar field plate trench, hence ensuring reliable blocking capability.

In the above, embodiments pertaining to power semiconductor dies and corresponding processing methods were explained. For example, these semiconductor dies are based on silicon (Si). Accordingly, a monocrystalline semiconductor region or layer or section can be a monocrystalline Si-region or Si-layer. In other embodiments, polycrystalline or amorphous silicon may be employed.

It should, however, be understood that the semiconductor die can be made of any semiconductor material suitable for manufacturing a semiconductor die. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor die having a semiconductor body coupled to a first load terminal and a second load terminal of the power semiconductor die and configured to conduct a load current between the load terminals, and comprising:
    a control trench structure for controlling the load current, the control trench structure extending into the semiconductor body along a vertical direction and arranged in accordance with a horizontal grid pattern having a plurality of grid openings; and
    a plurality of power cells, each power cell being, in a horizontal cross-section, at least partially arranged in a respective one of the plurality of grid openings, wherein at least one of the power cells comprises:
        a section of a drift zone of a first conductivity type, a section of a channel zone of a second conductivity type and a section of a source zone of the first conductivity type, wherein the channel zone section is electrically connected to the first load terminal and isolates the source zone section from the drift zone section;
        a control section with at least one control electrode section in the control trench structure; and
        a columnar field plate trench extending into the semiconductor body along the vertical direction and including a field plate electrode electrically coupled to the first load terminal, the columnar field plate trench having a deep portion below the channel zone section and a proximal portion above the deep portion, the proximal portion vertically overlapping with the channel zone section, wherein a deep horizontal width of the deep portion amounts to at least 110% of a proximal horizontal width of the proximal portion.

2. The power semiconductor die of claim 1, wherein, at least in a subportion of the proximal portion, a rate of change of the proximal horizontal width with respect to the vertical direction is either zero or negative.

3. The power semiconductor die of claim 1, wherein a total vertical extension of the deep portion amounts to at least 10% of a total vertical extension of the columnar field plate trench.

4. The power semiconductor die of claim 3, wherein a rate of change of the deep horizontal width with respect to the vertical direction is either zero or positive.

5. The power semiconductor die of claim 1, wherein the field plate electrode extends into each of the proximal portion and the deep portion.

6. The power semiconductor die of claim 1, wherein the columnar field plate trench includes a trench insulator that electrically isolates the field plate electrode from the semiconductor body.

7. The power semiconductor die of claim 6, wherein at least one of a horizontal width of the field plate electrode and a horizontal thickness of the field insulator increases along the vertical direction.

8. The power semiconductor die of claim 1, wherein the field plate electrode has a maximum width in a section that forms a part of the deep portion of the columnar field plate trench.

9. The power semiconductor die of claim 1, wherein the field plate electrode exhibits a void volume section.

10. The power semiconductor die of claim 9, wherein the void volume section extends into the deep portion and does not extend into the proximal portion.

11. The power semiconductor die of claim 1, wherein the deep portion forms, at least partially, a distal portion that terminates the columnar field plate trench along the vertical direction, wherein the distal portion includes no more than 30% of the total extension of the columnar field plate trench.

12. The power semiconductor die of claim 1, wherein the horizontal width of each columnar field plate trench changes in accordance with a constant rate of change along the vertical direction for at least 40% of the total vertical extension of the respective columnar field plate trench.

13. The power semiconductor die of claim 1, wherein the horizontal width of each columnar field plate trench increases for at least 70% of the total vertical extension of the respective columnar field plate trench.

14. The power semiconductor die of claim 1, wherein the horizontal width of each columnar field plate trench remains substantially constant along the vertical direction for at least 70% of the total vertical extension of the respective columnar field plate trench.

15. The power semiconductor die of claim 1, wherein an increase of at least 10% of the horizontal width of each columnar field plate trench occurs along no more than 30% of the total vertical extension of the respective columnar field plate trench.

16. The power semiconductor die of claim 15, wherein said no more than 30% of the total vertical extension of the respective columnar field plate trench forms a part of the deepest part of the respective columnar field plate trench.

17. The power semiconductor die of claim 1, wherein each grid opening exhibits a maximal horizontal extension of no more than 1 μm.

18. A power semiconductor die having a semiconductor body coupled to a first load terminal and a second load terminal of the power semiconductor die and configured to conduct a load current between the load terminals, and comprising:
   a control trench structure for controlling the load current, the control trench structure extending into the semiconductor body along a vertical direction and arranged in accordance with a horizontal grid pattern having a plurality of grid openings; and
   a plurality of power cells, each power cell being, in a horizontal cross-section, at least partially arranged in a respective one of the plurality of grid openings, and comprising:
      a section of a drift zone of a first conductivity type, a section of a channel zone of a second conductivity type and a section of a source zone of the first conductivity type, wherein the channel zone section is electrically connected to the first load terminal and isolates the source zone section from the drift zone section;
      a control section with at least one control electrode section in the control trench structure; and
      a columnar field plate trench extending into the semiconductor body along the vertical direction and including a field plate electrode electrically coupled to the first load terminal;
      wherein a horizontal distance between two columnar field plate trenches of two adjacent ones of the plurality of power cells decreases by at least 10% along the vertical direction.

19. A method of processing a power semiconductor die, the power semiconductor die having a semiconductor body coupled to a first load terminal and a second load terminal of the power semiconductor die and configured to conduct a load current between the load terminals, wherein the method comprises:
   forming a control trench structure for controlling the load current, the control trench structure extending into the semiconductor body along a vertical direction and arranged in accordance with a horizontal grid pattern having a plurality of grid openings; and
   forming a plurality of power cells, each power cell being, in a horizontal cross-section, at least partially arranged in a respective one of the plurality of grid openings, and comprising:
      a section of a drift zone of a first conductivity type, a section of a channel zone of a second conductivity type and a section of a source zone of the first conductivity type, wherein the channel zone section is electrically connected to the first load terminal and isolates the source zone section from the drift zone section; and
      a control section with at least one control electrode section in the control trench structure;
      wherein the method comprises forming, in at least one of the power cells, a columnar field plate trench extending into the semiconductor body along the vertical direction and including a field plate electrode electrically coupled to the first load terminal, the columnar field plate trench having a deep portion below the channel zone section and a proximal portion above the deep portion, the proximal portion vertically overlapping with the channel zone section, wherein a deep horizontal width of the deep portion amounts to at least 110% of a proximal horizontal width of the proximal portion.

20. A method of processing a power semiconductor die, the power semiconductor die having a semiconductor body coupled to a first load terminal and a second load terminal of the power semiconductor die and configured to conduct a load current between the load terminals, wherein the method comprises:
   forming a control trench structure for controlling the load current, the control trench structure extending into the semiconductor body along a vertical direction and arranged in accordance with a horizontal grid pattern having a plurality of grid openings; and
   forming a plurality of power cells, each power cell being, in a horizontal cross-section, at least partially arranged in a respective one of the plurality of grid openings, and comprising:
      a section of a drift zone of a first conductivity type, a section of a channel zone of a second conductivity type and a section of a source zone of the first conductivity type, wherein the channel zone section is electrically connected to the first load terminal and isolates the source zone section from the drift zone section; and
      a control section with at least one control electrode section in the control trench structure;
      wherein the method comprises forming, in each power cell, a columnar field plate trench extending into the semiconductor body along the vertical direction and including a field plate electrode electrically coupled to the first load terminal, wherein a horizontal distance between two columnar field plate trenches of two adjacent ones of the plurality of power cells decreases by at least 10% along the vertical direction.

* * * * *